United States Patent
Lee et al.

(10) Patent No.: US 10,789,193 B2
(45) Date of Patent: Sep. 29, 2020

(54) DEVICE CONNECTED TO OTHER DEVICE BY SINGLE WIRE AND METHOD OF OPERATING SYSTEM INCLUDING THE DEVICES

(71) Applicant: Samsung Electronics Co., Ltd., Suwon-si (KR)

(72) Inventors: Jae-shin Lee, Seoul (KR); Yo-han Lee, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 92 days.

(21) Appl. No.: 15/716,014

(22) Filed: Sep. 26, 2017

(65) Prior Publication Data

US 2018/0181513 A1    Jun. 28, 2018

(30) Foreign Application Priority Data

Dec. 22, 2016 (KR) .......................... 10-2016-0176846

(51) Int. Cl.
| | |
|---|---|
| *G06F 13/38* | (2006.01) |
| *G06F 13/40* | (2006.01) |
| *G06F 13/42* | (2006.01) |
| *G11C 16/26* | (2006.01) |

(52) U.S. Cl.
CPC .......... *G06F 13/385* (2013.01); *G06F 13/404* (2013.01); *G06F 13/4022* (2013.01); *G06F 13/4286* (2013.01); *G11C 16/26* (2013.01); *G06F 13/4291* (2013.01); *G11C 2207/108* (2013.01)

(58) Field of Classification Search
None
See application file for complete search history.

(56) References Cited

U.S. PATENT DOCUMENTS

| | | |
|---|---|---|
| 5,140,679 A | 8/1992 | Michael |
| 6,286,073 B1 | 9/2001 | Vegter |
| 7,558,900 B2 | 7/2009 | Jigour et al. |
| 7,788,438 B2 | 8/2010 | Kuo et al. |
| 8,510,492 B2 | 8/2013 | Martchovsky |
| 8,775,707 B2 | 7/2014 | Poulsen |
| 9,755,821 B2 | 9/2017 | Jang et al. |
| 2002/0146068 A1* | 10/2002 | Sumitomo .............. H04L 25/45 375/219 |

(Continued)

FOREIGN PATENT DOCUMENTS

| | | |
|---|---|---|
| JP | 08079225 | 3/1996 |
| JP | 09205469 | 8/1997 |

*Primary Examiner* — Donald L Mills
(74) *Attorney, Agent, or Firm* — Muir Patent Law, PLLC

(57) ABSTRACT

Provided are a device connected to another device by a single wire and a method of operating a system including the devices. The method of operating the device connected to the other device by the single wire includes transmitting a first packet to the other device, waiting to receive a second packet from the other device, and receiving the second packet from the other device. When the waiting to receive the second packet is started, electrically connecting a first end of a resistor to the first wire, and when the waiting to receive the second packet is terminated, electrically disconnecting a resistor from the first wire. A second end of the resistor is connected to either a logic high level voltage source or a logic low level voltage source.

20 Claims, 15 Drawing Sheets

(56) References Cited

U.S. PATENT DOCUMENTS

| | | | |
|---|---|---|---|
| 2005/0188136 A1* | 8/2005 | Ishikawa | G06F 13/385 710/106 |
| 2014/0115344 A1 | 4/2014 | Maier et al. | |
| 2014/0292384 A1 | 10/2014 | Wu et al. | |
| 2015/0074306 A1 | 3/2015 | Ayyagari et al. | |
| 2016/0364362 A1* | 12/2016 | Akers | G06F 13/4291 |
| 2017/0060791 A1 | 3/2017 | Huh et al. | |

* cited by examiner

DEVICE CONNECTED TO OTHER DEVICE BY SINGLE WIRE AND METHOD OF OPERATING SYSTEM INCLUDING THE DEVICES

CROSS-REFERENCE TO RELATED APPLICATION

This application claims the benefit of Korean Patent Application No. 10-2016-0176846, filed on Dec. 22, 2016, in the Korean Intellectual Property Office, the disclosure of which is incorporated herein in its entirety by reference.

BACKGROUND

The present disclosure relates to a device connected to other devices by a single wire and a method of operating a system including the device, and more particularly, to a device that transmits and receives data bi-directionally with other devices by a single wire and a method of operating a system including the device.

In telecommunications or computer science, serial communication denotes a process of transmitting data in a bit unit per time through a communication channel or a computer bus. The serial communication is compared to parallel communication that simultaneously transmits a large amount of bits through a link having many parallel channels. The serial communication may be used in all long-haul communications and most computer networks. The serial communication may be achieved between two devices connected in a single wire system in which the two devices are connected to each other by a single wire.

Many communication systems are designed to connect two devices on a printed circuit board (PCB) substrate. Many devices use a serial bus for transmitting data. A low-cost serial bus includes, for example, a serial peripheral interface (SPI) and an inter-integrated circuit (I2C).

SUMMARY

Exemplary embodiments provide a method of operating a device configured to prevent a conflict or floating phenomenon of data being communicated with other devices by a single wire.

The present disclosure provides a communication method of a system that includes a plurality of devices connected by a single wire and is configured to prevent a conflict or floating phenomenon of data being communicated with other devices.

According to an aspect of the inventive concept, there is provided a method of operating a first device connected to a second device by a first wire, the method including: transmitting a first packet to the second device through the first wire; waiting to receive a second packet from the second device; and receiving the second packet from the second device through the first wire, wherein when the waiting to receive the second packet is started, electrically connecting a first end of a resistor to the first wire, and when the waiting to receive the second packet is terminated, electrically disconnecting the first end of the resistor from the first wire. A second end of the resistor is connected to either a logic high level voltage source or a logic low level voltage source.

According to another aspect of the inventive concept, there is provided a method of data communication bi-directionally in a system including a first device and a second device connected to each other by a first wire, the method includes: using the first wire, requesting data from the second device by the first device; changing a transmission direction over the first wire from starting at the first device to starting at the second device; and receiving a packet from the second device by the first device over the first wire, wherein a termination time of changing the transmission direction is determined by the packet from the second device. The receiving a packet comprises receiving a request packet having a number of consecutive low level bits or a number of consecutive high level bits greater than a predetermined number of bits.

According to an aspect of the inventive concept, there is provided a system including: a first device including a first resistor, a second device connected to the first device by a first wire. The first device is configured to transmit a first packet to the second device through the first wire, and to wait for a second packet from the second device. The first device is configured to receive the second packet through the first wire. A first end of the first resistor is electrically connected to the first wire when the first device waits the second packet from the second device. The first end of the first resistor is electrically disconnected from the first wire when the first device receives the second packet from the second device. A second end of the first resistor is connected to either a logic high level voltage source or a logic low level voltage source.

According to an aspect of the inventive concept, there is provided a first wire communication system including: a first device; and a second device connected to the first device to be able to communicate with the first device by a single wire, wherein the first device and the second device transmit to each other a request packet for performing a request operation determined in advance.

BRIEF DESCRIPTION OF THE DRAWINGS

Exemplary embodiments will be more clearly understood from the following detailed description taken in conjunction with the accompanying drawings in which.

DETAILED DESCRIPTION

Figure 1:
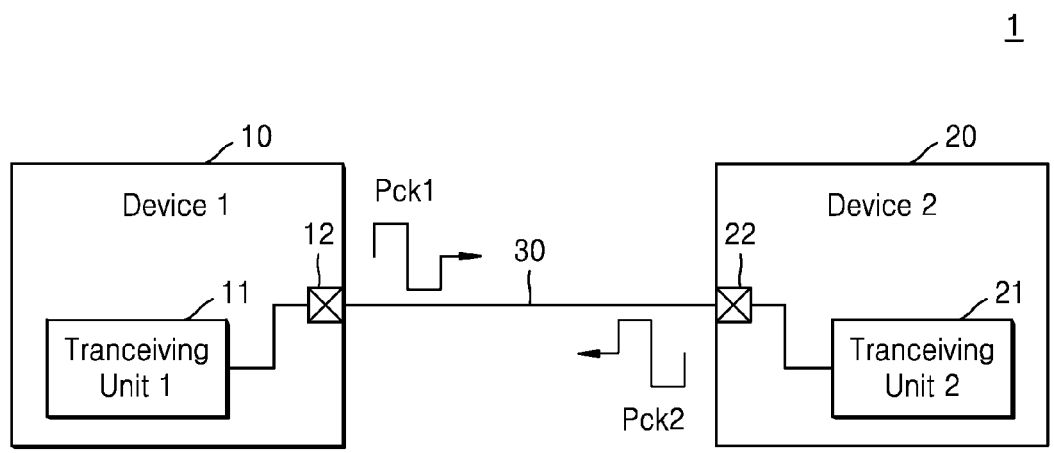
FIG. 1 is a block diagram showing a system according to example embodiments.

Various exemplary embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

It will be understood that, although the terms first, second, third etc. may be used herein to describe various elements, these elements should not be limited by these terms. Unless indicated otherwise, these terms are generally used to distinguish one element from another. Thus, a first element discussed below in one section of the specification could be termed a second element in a different section of the specification without departing from the teachings of the present disclosure. Also, terms such as "first" and "second" may be used in the claims to name an element of the claim, even thought that particular name is not used to describe in connection with the element in the specification. As used herein, the term "and/or" includes any and all combinations of one or more of the associated listed items.

As is traditional in the field of the disclosed technology, features and embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

As used herein, a device may refer to various items such as a memory device, one or more logic devices, a semiconductor chip, a memory chip, a memory die, a logic chip, a liquid crystal display (LCD) driver, a radio frequency (RF) transmitter or receiver, sensor, connectivity, a package, a package including one or more memory chips and optionally one or more logic chips, or combinations thereof. A device may comprise a package which may include one or more chips stacked on a package substrate, or a package-on-package device including a plurality of packages.

An electronic device, an electronic system, or a system as used herein, may refer to one of these devices and may also include products that include these devices, such as a memory card, a memory module, a hard drive including additional components, a mobile phone, laptop, tablet, desktop, camera, server, computing system, or other consumer electronic device, etc.

FIG. 1 is a block diagram showing a system 1 according to example embodiments.

Referring to FIG. 1, the system 1 may include a first device 10 and a second device 20. The system 1 may be referred to as an electronic device or an electronic system. The first device 10 and the second device 20 may be connected to each other by a single wire 30 (or, a first wire). As an example, each of the first and second devices may be a controller, a memory device, a logic device, a LCD driver, a RF transmitter or receiver, etc. In example embodiments, the first and second devices are connected to each other using only one wire. In other example embodiments, the first and second devices are connected to each other using a plurality of wires. The first device 10 may include a first tranceiving unit 11 and a first terminal (e.g., pad or pin) 12, and the second device 20 may include a second tranceiving unit 21 and a second terminal (e.g., pad or pin) 22. The first device 10 may transmit a first packet Pck1 to the second device 20 and may receive a second packet Pck2 by the single wire 30. According to an example embodiment of the present disclosure, the first device 10 may function as a master and the second device 20 may function as a slave, but the present example embodiment is not limited thereto. The first device 10 and the second device 20 may transmit and receive data in a packet unit. The packet is a unit for transmitting data and may include a start bit, a data bit, and a stop bit. The data bit may include an address signal, a command signal, a control signal, etc.

When the first device 10 transmits the first packet Pck1, the first device 10 may function as a transmitter, and when the first device 10 receives the second packet Pck2, the first device 10 may function as a receiver. When the first device 10 transmits the first packet Pck1, the first terminal 12 may function as a transmitting terminal Tx, and when the first device 10 receives the second packet Pck2, the first terminal 12 may function as a receiving terminal Rx.

Also, when the second device 20 receives the first packet Pck1, the second device 20 may function as a receiver, and when the second device 20 transmits the second packet Pck2, the second device 20 may function as a transmitter. When the second device 20 receives the first packet Pck1, the second terminal 22 may function as a receiving terminal Rx, and when the second device 20 transmits the second packet Pck2, the second terminal 22 may function as a transmitting terminal Tx.

The first tranceiving unit 11 may transmit the first packet Pck1 and may receive the second packet Pck2 to and from the first terminal 12 by being connected to the first terminal 12. Also, the second tranceiving unit 21 may transmit the second packet Pck2 and may receive the first packet Pck1 to and from the second terminal 22 by being connected to the second terminal 22. In the present specification, the expressions of transmission and receiving of data by the first device 10 and the second device 20 may denote that data are actually transmitted and received by the first tranceiving unit 11 and the second tranceiving unit 21.

According to an example embodiment of the present disclosure, before receiving the second packet Pck2 from the second tranceiving unit 21 after transmitting the first packet Pck1 to the second tranceiving unit 21 from the first tranceiving unit 11, the first device 10 and the second device 20 may have a handover state. The handover state may be terminated by a start bit included in the second packet Pck2 received from the second tranceiving unit 21, which will be described below with reference to FIG. 2. In example embodiments, the handover state may be terminated by a start bit included in another first packet Pck1_1 transmitted from the first tranceiving unit 11.

Figure 2:
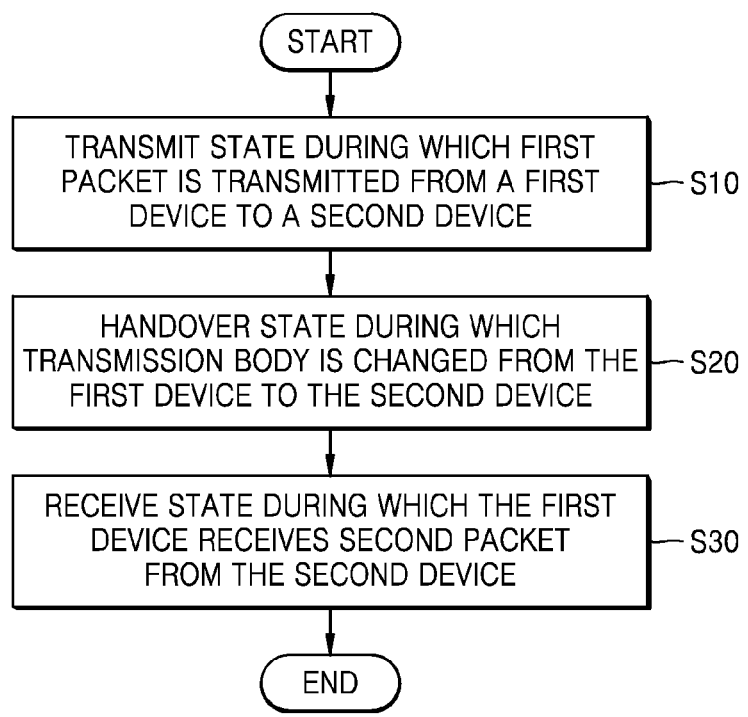
FIG. 2 is a flowchart showing a method of operating a system, according to example embodiments.

FIG. 2 is a flowchart showing a method of operating the system 1 according to example embodiments.

In example embodiments, referring to FIGS. 1 and 2, the method of operating the system 1 may include: a transmit state during which the first device 10 transmits the first packet Pck1 to the second device 20 (S10); a handover state during which a transmission body is changed from the first device 10 to the second device 20 (S20); and a receive state during which the first device 10 receives the second packet Pck2 from the second device 20 (S30).

In other example embodiments, a method of operating the system 1 may include: a first transmit state during which the first device 10 transmits the first packet Pck1 to the second device 20 (S10'); a handover state during which a transmission body is maintained by the first device 10 (S20'); and a second transmit state during which the first device 10 transmits another first packet Pck1_1 to the second device 20 (S30').

FIG. 2 shows a case where the first device 10 functions as a receiver after functioning as a transmitter. However, the present example embodiment is not limited thereto. For example, it should be understood that the technical scope of the present example embodiment of the inventive concept may be applied to a case where the second device 20 functions as a receiver after functioning as a transmitter.

The first packet Pck1 may include a first start bit, a first data, and a first stop bit, and the second packet Pck2 may include a second start bit, a second data, and a second stop bit. The transmit state (S10) (also described as a transmitting state) of the first packet Pck1 (S10) may be started by transmitting the first start bit to the second device 20 from the first device 10. In the transmit state (S10), the first device 10 may transmit the first data to the second device 20. Afterwards, when the first device 10 transmits the first stop bit to the second device 20, the transmit state (S10) may be terminated and the handover state (S20) may be started. In an example embodiment of the present disclosure, the handover state (S20) may be started as an activation of a pull-up resistor. Also, the pull-up resistor may be maintained in the handover state (S20) as an activated state. The pull-up resistor will be described in detail with reference to FIG. 6.

The handover state (S20) may be terminated by a second start bit received by the first device 10 from the second device 20 and the receive state (S30) may be started. The first device 10 according to an example embodiment of the present disclosure may detect the second start bit and may inactivate the pull-up resistor in response to the detection of the second start bit. For example, the second start bit may function as a level trigger, and the first device 10 may detect the level trigger by the second start bit. In the receive state (S30), the first device 10 may receive the second data from the second device 20. When the first device 10 receives a second stop bit from the second device 20, the receive state (S30) is terminated and the first device 10 may enter an idle state.

The handover state (S20) may start when the first device 10 transmits a first stop bit to the second device 20, and may be terminated when the first device 10 receives a second start bit from the second device 20. The operations described above during the handover state (S20) may be referred to as a hand-shaking state. Since the handover state (S20) is performed by the hand-shaking state, a termination point of the handover state (S20) may be freely controlled by a receiving device, and thus, a floating phenomenon that may occur when data are not transmitted or received and a conflict phenomenon that may occur when data are simultaneously transmitted in bi-directions may be prevented. Also, although operation frequencies of the first device 10 and the second device 20 are different from each other, a data loss due to the different operation frequencies may be prevented by determining a termination point of the handover state (S20).

Figure 3:
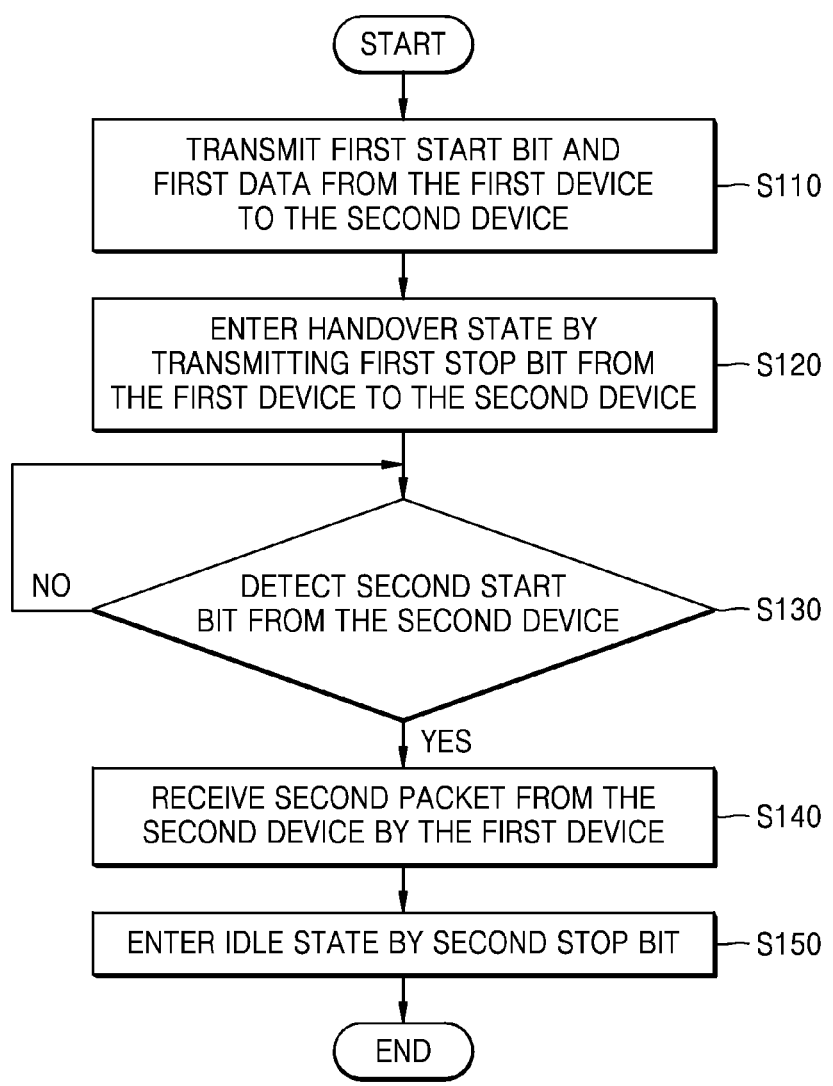
FIG. 3 is a flowchart showing a method of operating a device, according to example embodiments.

FIG. 3 is a flowchart showing a method of operating the devices 10 and 20 according to example embodiments.

Referring to FIGS. 1 and 3, the first device 10 may transmit a first start bit and a first data included in the first packet Pck1 to the second device 20 (S110). When the transmission of the first data from the first device 10 to the second device 20 is completed, the first device 10 may transmit a first stop bit to the second device 20, and thus, the handover state may be started (S120). In an example embodiment of the present disclosure, the first device 10 may maintain a voltage of the single wire 30 at a high level by activating a pull-up resistor during the handover state (shown in FIG. 6).

During the handover state, the first device 10 may detect the receipt of the second start bit transmitted from the second device 20 (S130). When the first device 10 receives the second start bit from the second device 20, the first device 10 may receive the second packet Pck2 from the second device 20 (S140). When the first device 10 receives a second stop bit after receiving all the second data included in the second packet Pck2 from the second device 20, the system 1 may enter an idle state (S150).

Figure 4A:
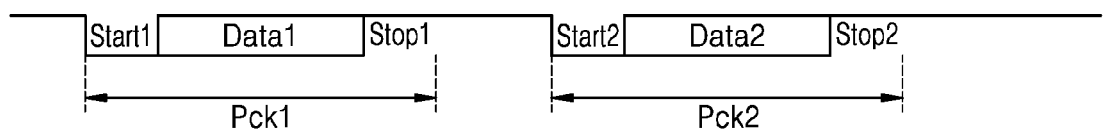
FIGS. 4A and 4B are timing diagrams showing a first packet and a second packet, according to example embodiments.
Figure 4B:
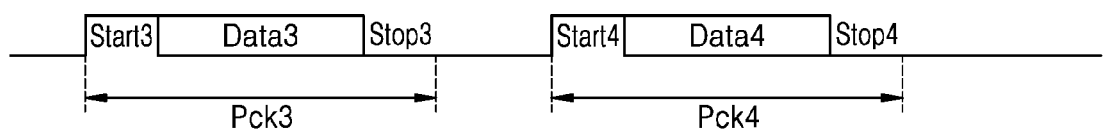

FIGS. 4A and 4B are timing diagrams showing the first packet Pck1 and the second packet Pck2 according to example embodiments.

Referring to FIGS. 1, 4A, and 4B, the first packet Pck1 may be a packet to be transmitted from the first device 10 to the second device 20, and the second packet Pck2 may be a packet to be received from the second device 20 by the first device 10. Also, the first packet Pck1 may be a packet to be received from the second device 20 by the first device 10, and the second packet Pck2 may be a packet to be transmitted to the second device 20 from the first device 10. Also, a third packet Pck3 may be another example of the first packet Pck1, and a fourth packet Pck4 may be another example of the second packet Pck2. For example, the third and fourth packets Pck3 and Pck4 may express different cases of a voltage level of a start bit of the first and second packets Pck1 and Pck2. The third and fourth packets Pck3 and Pck4 will be described in FIG. 4B.

Referring to FIG. 4A, the first packet Pck1 may include a first start bit Start1 of a low level, a first data Data1, and a first stop bit Stop1 of a high level. The second packet Pck2 may include a second start bit Start2 of a low level, a second data Data2, and a second stop bit Stop2 of a high level. In this case, the first device 10 may include at least one pull-up resistor connected between a power supply voltage VDD (e.g., a logic high level voltage source) and the first terminal 12, which is connected to the single wire 30. The first device 10 may maintain a high level at the first terminal 12 during a handover state by activating the pull-up resistor before transmitting the first stop bit Stop1 to the second device 20. When the first device 10 receives a second start bit Start2 having a level different from the first stop bit Stop1, the handover state may be terminated by inactivating the pull-up resistor.

In example embodiments, the first data Data1 of the first packet Pck1 may start after the first start bit Start1 is maintained at the low level for a first predetermined period of time. As an example, the first data Data1 of the first packet Pck1 may be started when the first start bit Start1 is maintained at a low level.

Also, the second data Data2 of the second packet Pck2 may start after the second start bit Start2 is maintained at a low level for a second predetermined period of time. As an example, the second data Data2 of the second packet Pck2 may be started when the second start bit Start2 is maintained at a low level.

In example embodiments, the system 1 or a host (not shown) connected to the system 1 may decide the first predetermined period of time and the second predetermined period of time. As an example, an amount of the first predetermined of time is the same as or different from an amount of the second predetermined of time.

Referring to FIG. 4B, the third packet Pck3 may include a third start bit Start3 of a high level, a third data Data3, and a third stop bit Stop3 of a low level. The fourth packet Pck4 may include a fourth start bit Start4 of a high level, a fourth data Data4, and a fourth stop bit Stop4 of a low level. In this case, the first device 10 may include at least one pull-down resistor connected between a ground voltage GND and the first terminal 12 connected to the single wire 30. The first device 10 may maintain the low level at the first terminal 12 during a handover state by activating the pull-down resistor before transmitting the third stop bit Stop3 to the second device 20. When the first device 10 receives a fourth start bit Start4 having a level different from that of the third stop bit Stop3, the pull-down resistor may be inactivated, and thus, the handover state may be terminated.

Afterwards, in the present disclosure, example embodiments will be described based on the first packet Pck1 and the second packet Pck2 depicted in FIG. 4A. However, it should be understood that these examples may be inferred to be applied to the cases of the third packet Pck3 and the fourth packet Pck4.

Figure 5:
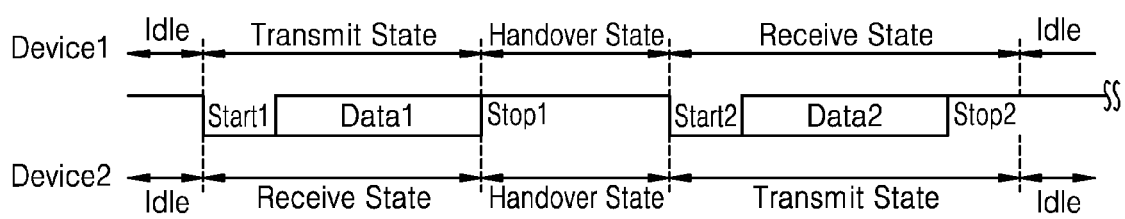
FIG. 5 is a timing diagram showing a transmit state according to example embodiments.

FIG. 5 is a timing diagram showing a transmitting state according to example embodiments. In describing the present example embodiment, the same contents that have been described above with reference to FIGS. 2 and 4A will not be repeated.

Referring to FIGS. 2, 4A, and 5, the first device 10 may function as a transmitter by a first start bit Start1 of a low level while maintaining an idle state IDLE, and thus, may enter a transmitting state. At the same time, the second device 20 may function as a receiver, and thus, may enter a receiving state. When the first device 10 transmits a first stop bit Stop1 to the second device 20 after the transmission of a first data Data1 to the second device 20 is completed, the first device 10 and the second device 20 may enter a handover state during which the transmission role and the receiving role of the first device 10 and the second device 20 are reversed. During the handover state, the first device 10 may maintain a high voltage level of the single wire 30 by activating a pull-up resistor.

In example embodiments, a start time point and an end time point of the first data Data1 may be predetermined.

When the second device 20 is ready to transmit a data, the second device 20 may enter a transmit state by transmitting a second start bit Start2 to the first device 10. The first device 10 may detect a low level triggering of the received second start bit Start2 and may inactivate the pull-up resistor. Afterwards, the first device 10 may terminate the handover state and may enter a receiving state. When the second device 20 finishes the transmission of the second data Data2 to the first device 10, the second device 20 transmits the second stop bit Stop2 to the first device 10, and then, the first device 10 and the second device 20 may enter an idle state.

In example embodiments, a start time point and an end time point of the second data Data2 may be predetermined.

In an example embodiment of the present disclosure, the second device 20 may re-enter a handover state by activating a pull-up resistor included in the second device 20 without entering the idle state IDLE (not shown). The second device 20 may terminate the handover state by inactivating the pull-up resistor by recognizing a first start bit Start1 transmitted from the first device 10.

In example embodiments, each of the first and second devices 10 and 20 may activate the pull-up resistor during the handover state, and may inactivate the pull-up resistor during the idle state. As an example, each of the first and second devices 10 and 20 may provide a high level voltage to the single wire 30 during the idle state.

Figure 6:
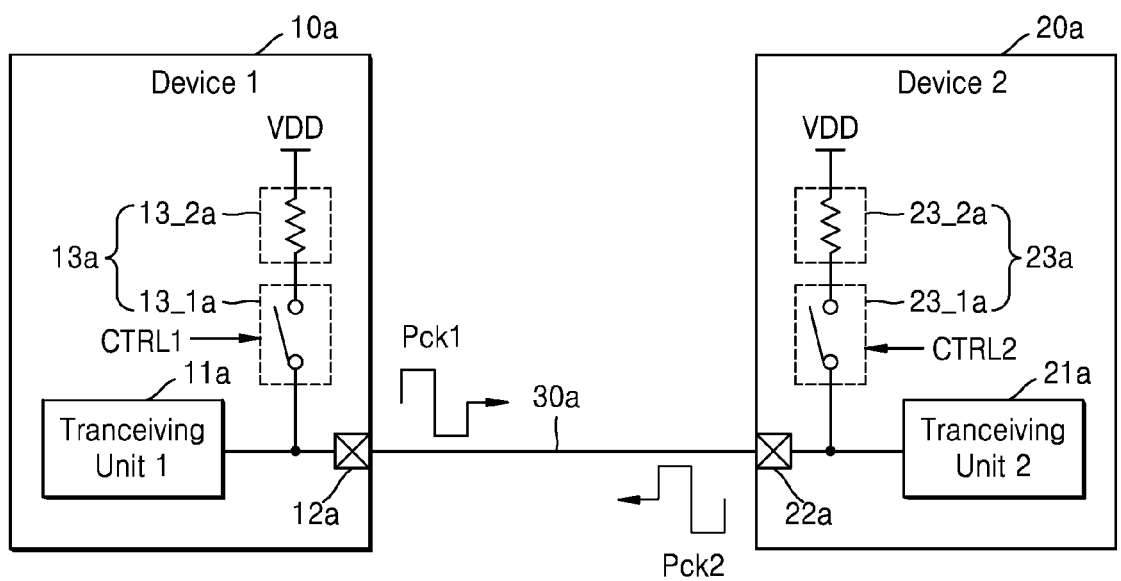
FIG. 6 is a block diagram showing a system according to other example embodiments.

FIG. 6 is a block diagram showing a system 1a according to example embodiments. In describing the present example embodiment, the same contents that have described above with reference to FIG. 1 will not be repeated.

Referring to FIG. 6, the system 1a may include a first device 10a and the second device 20a that are connected to each other by a single wire 30a. The first device 10a may include a first tranceiving unit 11a, a first terminal 12a, and a first pull-up unit 13a. The second device 20a may include a second tranceiving unit 21a, a second terminal 22a, and a second pull-up unit 23a. The first tranceiving unit 11a, the first terminal 12a, the second tranceiving unit 21a, and the second terminal 22a may be substantially the same or similar to the first tranceiving unit 11, the first terminal 12, the second tranceiving unit 21, and the second terminal 22 of FIG. 1, respectively, and thus, the descriptions thereof will not be repeated.

The first pull-up unit 13a may change the role of transmitter from the first device 10a to the second device 20a. For example, the first pull-up unit 13a may change a transmission body (e.g., a transmission direction or a transmission initiator) from starting at the first device 10a to starting at the second device 20a. When the first device 10a completes the transmission of a first packet Pck1 to the second device 20a over the single wire 30a, the first pull-up unit 13a may be activated by the first device 10a. When the second device 20a starts the transmission of a second packet Pck2 to the first device 10a, the first pull-up unit 13a may be inactivated by the first device 10a.

The second pull-up unit 23a may change the role of transmitter from the second device 20a to the first device 10a. For example, the second pull-up unit 23a may change a transmission direction from starting at the second device 20a to starting at the first device 10a. When the second device 20a completes the transmission of a second packet Pck2 to the first device 10a over the single wire 30a, the second pull-up unit 23a may be activated by the second device 20a. When the first device 10a starts the transmission of a first packet Pck1 to the second device 20a, the second pull-up unit 23a may be inactivated by the second device 20a.

In FIG. 6, both of the first pull-up unit 13a and the second pull-up unit 23a are depicted. However, the technical scope of the inventive concept is not limited thereto, for example, only a single pull-up unit may be included in the system 1a. For example, the single pull-up unit may perform a pull-up with respect to a voltage level of the single wire 30a by being connected to the first device 10a, the second device 20a, and the single wire 30a.

The first pull-up unit 13a may include a first pull-up switch 13_1a and a first pull-up resistor 13_2a, and the second pull-up unit 23a may include a second pull-up switch 23_1a and a second pull-up resistor 23_2a.

The first pull-up switch 13_1a may control a connection between the first pull-up resistor 13_2a and the single wire 30a in response to a control signal CTRL1 of the first device 10a. Also, the second pull-up switch 23_1a may control a connection between the second pull-up resistor 23_2a and the single wire 30a in response to a control signal CTRL2 of the second device 20a. For this purpose, the first pull-up switch 13_1a and the second pull-up switch 23_1a may include at least one switching device (for example, a transistor) that performs a switching operation.

As an example, the first pull-up unit 13a may be activated by connecting the first pull-up resistor 13_2a to the first terminal 12a, and inactivated by disconnecting the first pull-up resistor 13_2a from the first terminal 12a. As an example, the second pull-up unit 23a may be activated by connecting the second pull-up resistor 23_2a to the second terminal 22a, and inactivated by disconnecting the second pull-up resistor 23_2a from the second terminal 22a.

When the transmission of the first packet Pck1 is completed and the first device 10a enters a handover state, the first device 10a may connect the first pull-up resistor 13_2a to the single wire 30a by controlling the first pull-up switch 13_1a. The first pull-up resistor 13_2a may be connected to the power supply voltage VDD. Accordingly, a voltage level of the single wire 30a may be maintained at a logic high level by the first pull-up resistor 13_2a. Also, when the first device 10a detects the receipt of a start bit of the second packet Pck2 transmitted from the second device 20a, the first device 10a may separate the first pull-up resistor 13_2a and the single wire 30a from each other by controlling the first pull-up switch 13_1a.

When the transmission of the second packet Pck2 is completed and the second device 20a enters a handover state, the second device 20a may connect the second pull-up resistor 23_2a to the single wire 30a by controlling the second pull-up switch 23_1a. The second pull-up resistor 23_2a may be connected to the power supply voltage VDD. Accordingly, a voltage level of the single wire 30a may be maintained at a logic high level by the second pull-up resistor 23_2a. Also, when the second device 20a detects the receipt of a start bit of the first packet Pck1 transmitted from the first device 10a, the first device 10a may separate the second pull-up resistor 23_2a and the single wire 30a from each other by controlling the second pull-up switch 23_1a.

In example embodiments, the first pull-up switch 13_1a and the first pull-up resistor 13_2a may maintain the voltage level of the single wire 30a at a logic high level during a handover state during which the transmission direction is changed from starting at the first device 10a to starting at the second device 20a after the first device 10a transmits the first packet Pck1 to the second device 20a. Also, the second pull-up switch 23_1a and the second pull-up resistor 23_2a may maintain the voltage level of the single wire 30a at a logic high level during a handover state during which the transmission direction is changed from starting at the second device 20a to starting at the first device 10a after the second device 20a transmits the second packet Pck2 to the first device 10a.

In FIG. 6, like in FIG. 4a, a case where the first start bit Start1 and the second start bit Start2 of the first packet Pck1 and the second packet Pck2 have a low level is depicted. However, as depicted in FIG. 4b, in the case when the third start bit Start3 and the fourth start bit Start4 of the third packet Pck3 and the fourth packet Pck4 have a high level, the first pull-up resistor 13_2a and the second pull-up resistor 23_2a respectively may be replaced by a pull-down resistor connected to a ground voltage GND (e.g., a logic low level voltage source). The pull-down resistor may maintain a voltage level of the single wire 30a at logic low level during the handover state.

Figure 7:
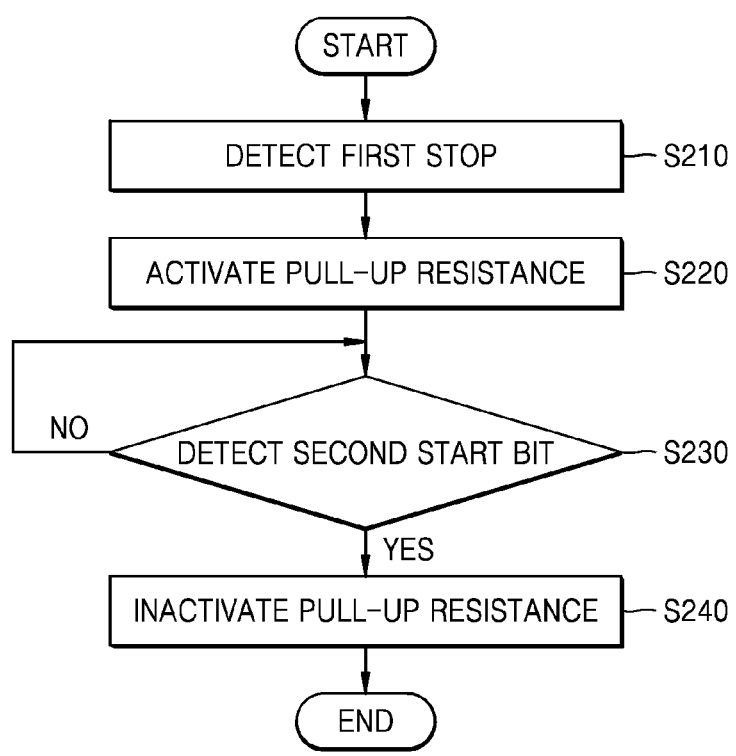
FIG. 7 is a flowchart showing a method of operating a device, according to example embodiments.

FIG. 7 is a flowchart showing a method of operating a device according to example embodiments.

Referring to FIGS. 4a, 6, and 7, when the first device 10a detects the first stop bit Stop1 included in the first packet Pck1 (S210), first device 10a may activate the first pull-up resistor 13_2a by controlling the first pull-up switch 13_1a (S220). When the first pull-up resistor 13_2a is activated, the voltage level of the single wire 30a may be maintained at a logic high level. Afterwards, when the first device 10a detects the second start bit Start2 transmitted from the second device 20a (S230), the first device 10a may inactivate the first pull-up resistor 13_2a by controlling the first pull-up switch 13_1a (S240).

Figure 8:
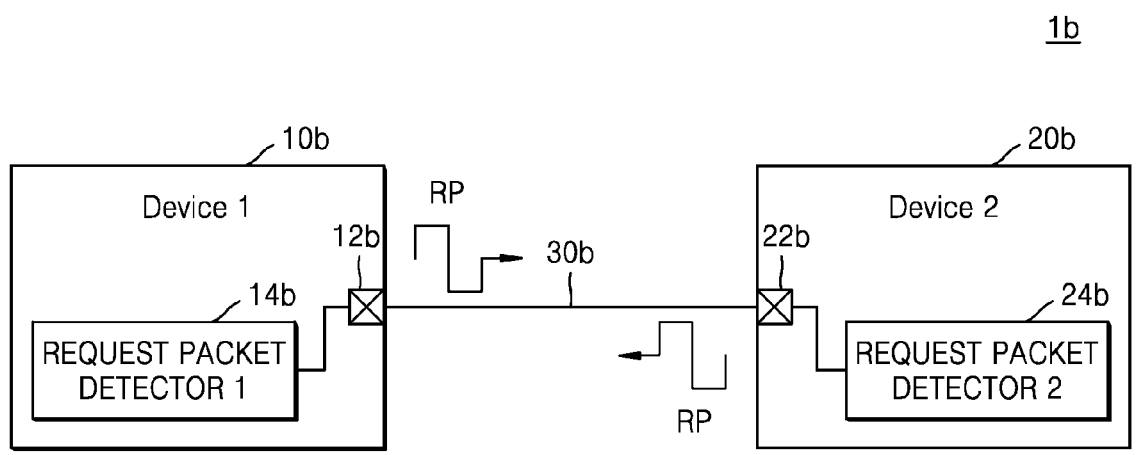
FIG. 8 is a block diagram showing a system according to example embodiments.

FIG. 8 is a block diagram showing a system 1b according to example embodiments. In describing the present example embodiment, the same contents that have described above with reference to FIG. 1 will not be repeated.

Referring to FIGS. 1 and 8, the system 1b may include a first device 10b and a second device 20b. The first device 10b and the second device 20b may be connected to each other by a single wire 30b. The first device 10b may include a first request packet detector 14b and a first terminal 12b, and the second device 20b may include a second request packet detector 24b and a second terminal 22b. The first terminal 12b may be substantially equal or similar to the first terminal 12 of FIG. 1, and the second terminal 22b may be equal or similar to the second terminal 22 of FIG. 1, and thus, the descriptions thereof will not be repeated.

The first device 10b may transmit or receive a request packet RP to or from the second device 20b. The request packet RP may denote a packet that requests an operation determined in advance, and as a non-limiting example, the request packet RP may be a packet that requests a reset. In example embodiments, when the request packet RP is a packet that requests a reset, a corresponding unit (e.g., a circuit or a node in the circuit) is reset. As other examples, the request packet RP may have a format determined in advance. In example embodiments, the request packet RP may have a number of consecutive low level bits greater than a number of low level bits determined in advance. In other example embodiments, the request packet RP may have a number of consecutive low level bits greater than a number of a normal packet size (e.g., a start bit, a data bit, and a stop bit), which will be described with reference to FIG. 9.

In example embodiments, the request packet RP may have a number of consecutive high level bits greater than a number of high level bits determined in advance. In other example embodiments, the request packet RP may have a number of consecutive high level bits greater than a number of the normal packet size (e.g., a start bit, a data bit, and a stop bit).

The first request packet detector 14b and the second request packet detector 24b may detect whether a packet receiving is a request packet RP or not. In example embodiments, each of the first request packet detector 14b and the second request packet detector 24b may include a counter, and may count the low level bits. When a number of low level bits are counted more than a predetermined value, the first request packet detector 14b or the second request packet detector 24*b* that receives a request packet RP may output various signals in response to a predetermined operation.

In example embodiments, the first request packet detector 14*b* may include a first reset generator (not shown), and the second request packet detector 24*b* may include a second reset generator (not shown). For example, if the predetermined operation is a reset operation, the first request packet detector 14*b* or the second request packet detector 24*b* may output a reset command signal to a reset generator, and the reset generator may perform a reset operation by outputting a reset signal. As an example, when a device receives the reset signal the device may be initialized or fixed to a specific state.

In FIG. 8 and drawings after FIG. 8, an example embodiment in which the request packet RP having a number of consecutive low level bits more than the predetermined value is described. However, this is only an example embodiment of the present inventive concept, for example, the request packet RP may have more than a number of consecutive low level bits determined in advance or may have a pattern determined in advance.

The first device 10*b* and the second device 20*b* may terminate the receiving of a request packet RP by a hand-shaking method described with reference to FIG. 2 and other drawings, and then, may perform the next operation. For example, when a high level bit is received after receiving all of the consecutive low level bits are received, a device that receives the request packet RP may determine that the receiving of the request packet RP is completed, and then, may perform an operation corresponding to the received request packet RP. Since the receiving of the request packet RP is terminated by the hand-shaking method, the number of low level bits of the request packet RP may be freely controlled. As an example, when the first device 10*b* transmits a number of consecutive low level bits more than a predetermined value, the second request packet detector 24*b* of the second device 20*b* may count the transmitted a number of consecutive low level bits and may determine whether the transmitted a number of consecutive low level bits is more than a predetermined value or not. When the number of consecutive low level bits more than the predetermined value are received and then a high level bit is received, the second device 20*b* may determine that the receiving of the request packet RP is terminated and may perform an operation corresponding to the request packet RP. Since the request packet RP is freely received, and afterwards, a subsequent operation may be performed through the hand-shaking method described above, a data conflict phenomenon or a floating phenomenon may be prevented.

In example embodiments, when the first device 10*b* functions as a master and the second device 20*b* functions as a slave, the first device 10*b* may transmit a request packet RP instead of a write dada Wdata, and the second device 20*b* may transmit a request packet RP instead of a read data Rdata corresponding to a read request of the first device 10*b*, which will be described with reference to FIG. 10.

Figure 9:
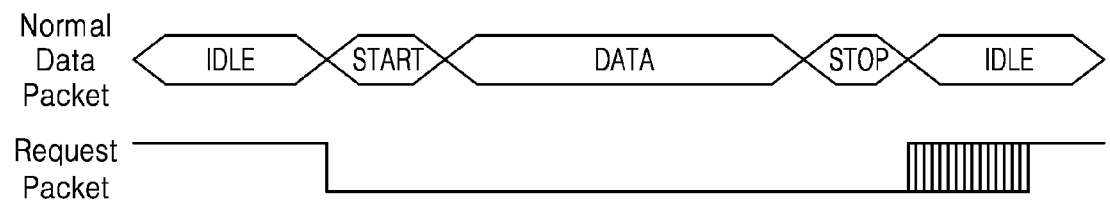
FIG. 9 is a timing diagram showing a request packet according to example embodiments.

FIG. 9 is a timing diagram showing a request packet according to example embodiments. In describing the present example embodiment, the same contents that have described above with reference to FIG. 8 will be omitted.

Referring to FIGS. 8 and 9, a request packet RP may have a number of consecutive low level bits greater than a number of total bits of a start bit, a data bit, and a stop bit of a normal data packet. In the present disclosure, the normal data packet may refer to a general packet including transmitting and/or receiving data between devices, and may have a number of bits determined in advance. A device that transmits a request packet may transmit consecutive low level bits to a counter device during an idle state IDLE to request an operation corresponding to the request packet. In example embodiments, although a low level bit is further received after a stop bit is received by a hand-shaking, if a high level bit is not entered, the receiving device may continuously receive a request packet, and when a high level bit is received after the transmission of the request packed is completed, the receiving device may perform the next operation.

Figure 10:
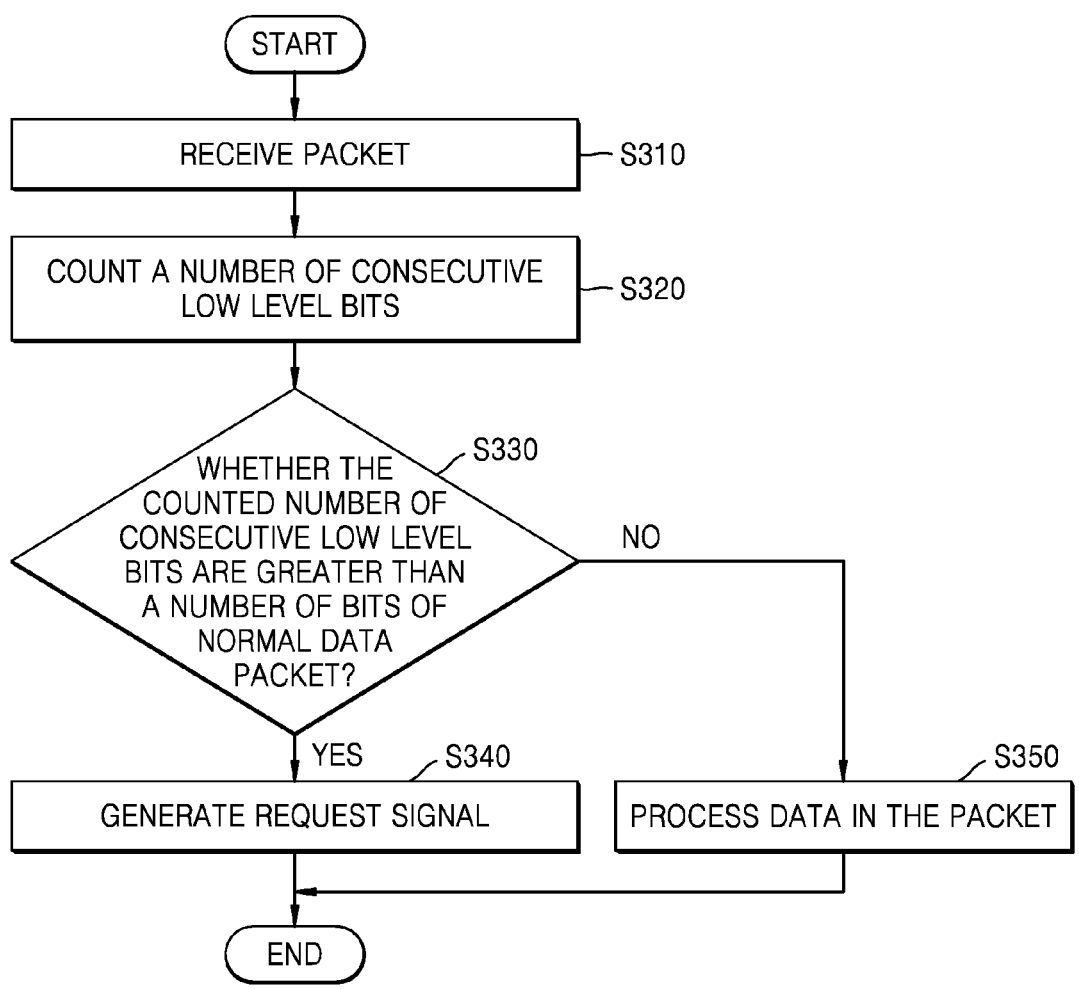
FIG. 10 a flowchart showing a method of operating a system, according to example embodiments.

FIG. 10 a flowchart showing a method of operating the first and second devices 10*b* and 20*b* according to example embodiments.

Referring to FIGS. 8 and 10, when the first device 10*b* and the second device 20*b* receive a packet (S310), the first and second request packet detectors 14*b* and 24*b* may count received a number of consecutive low level bits (S320). The first and second request packet detectors 14*b* and 24*b* may determine whether the counted number of consecutive low level bits are greater than a number of bits of a normal data packet or not (S330). If the counted number of consecutive low level bits are greater than the number of bits of the normal data packet, the first or second request packet detector 14*b* or 24*b* may generate a request signal (S340). If the counted number of consecutive low level bits are not greater than the number of bits of the normal data packet, the first or second request packet detector 14*b* or 24*b* may not involve the data process, but the first device 10*b* or the second device 20*b* may process data included in the packet (e.g., the normal packet).

Figure 11:
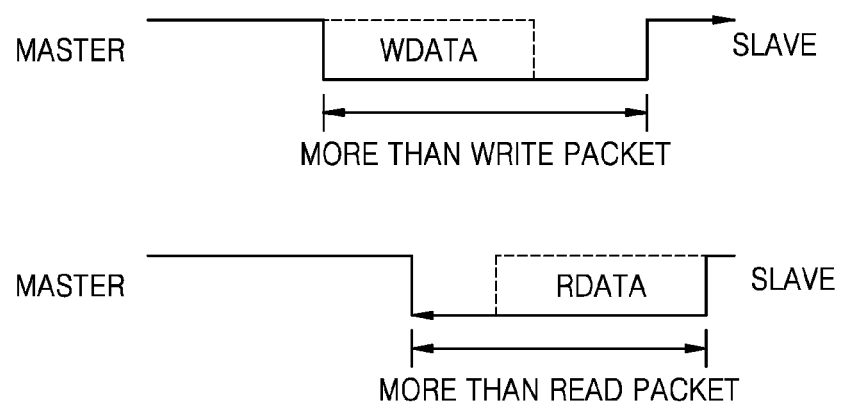
FIG. 11 is a timing diagram showing a transmission and receiving of a request packet between a master and a slave, according to example embodiments.

FIG. 11 is a timing diagram showing a transmission/receiving of a request packet between a master and a slave, according to example embodiments. In describing the present example embodiment, the same contents that have described above with reference to FIG. 8 will be omitted.

Referring to FIGS. 8 and 11, a master may transmit a request packet RP to a slave, and may receive a request packet RP from the slave. In an example embodiment of the present disclosure, the master may be a device that manages a system and outputs a command to the slave in a normal operation, and the slave may be a device that performs an operation corresponding to the command of the master in the normal operation.

When the master transmits a request packet to the slave, the master may transmit a number of consecutive low level bits greater than a number of bits of a write packet including write data to the slave. For example, when the slave receives the number of consecutive low level bits greater than the number of bits of the write packet, the slave recognizes the packet as a request packet RP and may perform a request operation corresponding to the request packet RP.

When the master receives a request packet RP from the slave, the master may ahead output a normal read command to the slave. The slave that receives the read command may determine whether it is necessary to output a request packet RP to the master or not, and when the slave determines that it is necessary to output the request packet RP, the slave may transmit a number of consecutive low level bits greater than a number of bits of the read packet including read data to the master. For example, when the master receives the number of consecutive low level bits greater than the number of bits of the read packet, the master recognizes the packet as a request packet RP, and may perform a request operation corresponding to the request packet RP.

In example embodiments, the number of bits of the write packet or the number of bits of the read packet may be predetermined.

Figure 12:
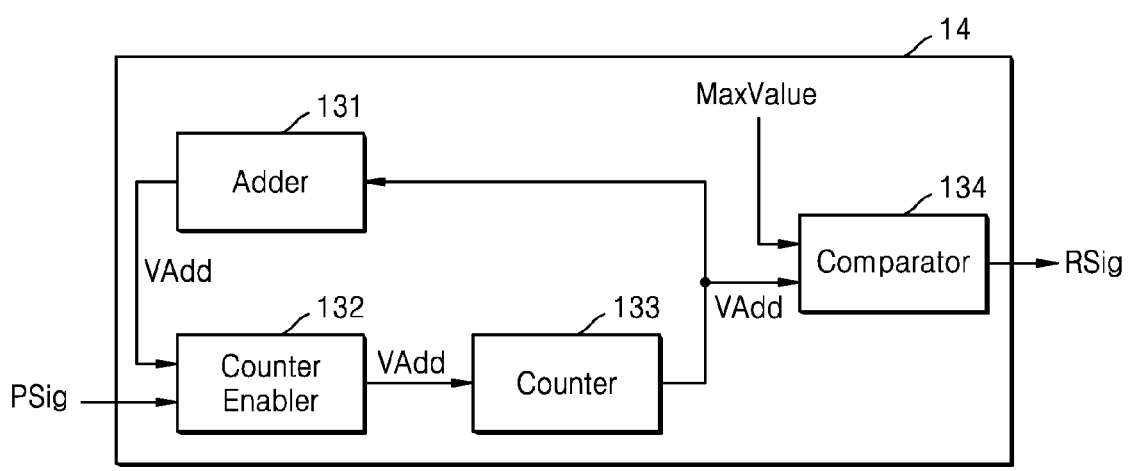
FIG. 12 is a block diagram showing a request packet detector according to example embodiments.

FIG. 12 is a block diagram showing a request packet detector 14 according to example embodiments.

Referring to FIG. 12, the request packet detector 14 may include an adder 131, a counter enabler 132, a counter 133, and a comparator 134. When a packet signal PSig is received by the request packet detector 14, the counter enabler 132 may determine whether the packet signal PSig is a logic low signal or a logic high signal. The packet signal PSig may denote each of the consecutive bits included in the packet received by the request packet detector 14. If the counter enabler 132 determines that the packet signal PSig is a logic low signal, the counter enabler 132 may transmit an added value VAdd received from the adder 131 to the counter 133. For this purpose, an inverter may be connected to an end of the counter enabler 132 where the packet signal PSig is received, and the counter enabler 132 may include at least one AND gate.

When the counter 133 receives an added value VAdd, the counter 133 may perform counting according to a clock signal, and may output the added value VAdd to the adder 131 and the comparator 134. For this purpose, the counter 133 may include at least one counting device (for example, a flip-flop). The adder 131 may re-output a value made by adding 1 to the added value VAdd to the counter enabler 132. Also, the comparator 134 may compare the received added value VAdd with a value MaxValue determined in advance whether the received added value VAdd is equal to the value MaxValue determined in advance. For this purpose, the comparator 134 may include at least one XOR gate. In an example embodiment of the present disclosure, the value MaxValue determined in advance may be the total number of bits of the normal packet (e.g., a read packet or a write packet). In example embodiments, the value MaxValue determined in advance is stored in the request packet detector 14. In other example embodiments, the request packet detector 14 may receive the value MaxValue from the outside.

The request packet detector 14 may repeat the above operation while receiving the consecutive low level bits as the packet signal PSig. When a high level bit is received as the packet signal PSig, the counter enabler 132 may output an initialized added value VAdd to the counter 133.

Figure 13:
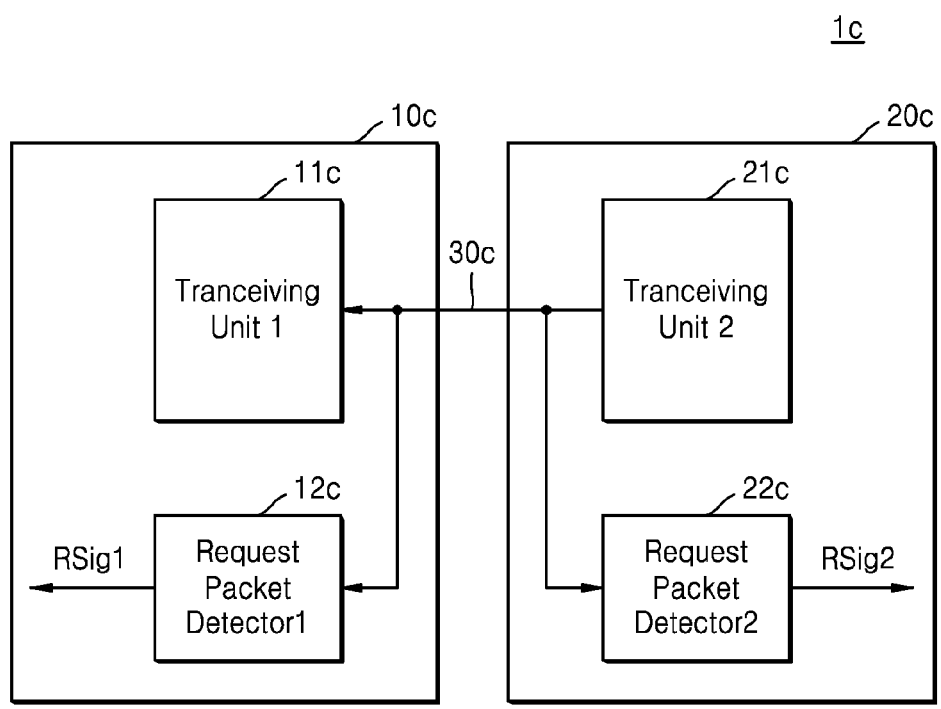
FIG. 13 is a block diagram showing a system according to example embodiments.

FIG. 13 is a block diagram showing a system 1c according to example embodiments. In describing the present example embodiment, the same contents that have described above with reference to FIGS. 1 and 12 will be omitted.

Referring to FIGS. 1, 12, and 13, the system 1c may include a first device 10c and a second device 20c. The system 1c may be referred to as an electronic device or an electronic system. The first device 10c and the second device 20c may be connected to each other by a single wire 30c. The first device 10c may include a first tranceiving unit 11c and a first request packet detector 12c. The second device 20c may include a second tranceiving unit 21c and a second request packet detector 22c. The first device 10c and the second device 20c may be substantially the same as or similar to first device 10 and the second device 20 of FIG. 1, and thus, the descriptions thereof will not be repeated. The first and second request packet detectors 12c and 22c may perform substantially the same operation, and thus, the description may be made based on the first request packet detector 12c.

The first request packet detector 12c may simultaneously receive a data packet when the second device 20c transmits the data packet to the first device 10c. The first request packet detector 12c may receive the data packet by using a method equal or similar to the method described with reference to FIG. 12, and may determine whether the data packet is a request packet RP or not. When the first request packet detector 12c determines that the received data packet is the request packet RP, the first request packet detector 12c may output a request signal Rsig1 with respect to a request operation determined in advance. For example, if the request operation is a reset operation, the first request packet detector 12c may output a reset command signal as a first request signal RSig1.

Also, when the second request packet detector 22c determines that a data packet received from the first device 10c is a request packet RP by analyzing the data packet, the second request packet detector 22c may output a second request signal RSig2. The first request signal RSig1 and the second request signal RSig2 may be request signals for performing the same request operations, or request signals for performing different request operations from each other.

In FIG. 13, both the first request packet detector 12c connected to a side of the first device 10c and the second request packet detector 22c connected to a side of the second device 20c are described. However, the inventive concept is not limited thereto, for example, the first or second request packet detector 12c or 22c may be connected to only one side of the first device 10c and the second device 20c. For example, one of the first and second request packet detectors 12c and 22c may determine whether a packet received by the first device 10c and the second device 20c is a request packet RP or not, and afterwards, the one of the first and second request packet detectors 12c and 22c may output a request signal to a corresponding functional block determined in advance.

Figure 14:
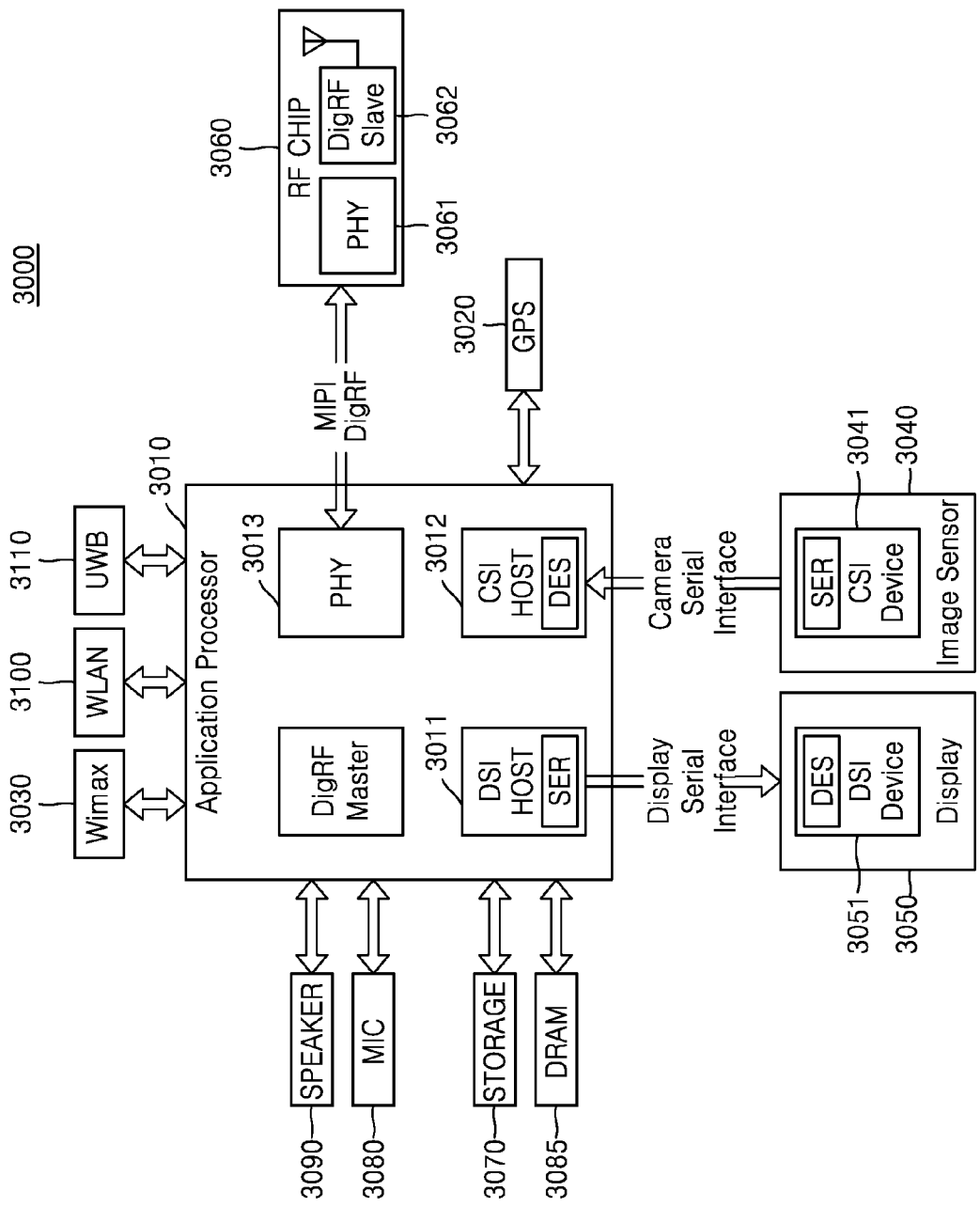
FIG. 14 shows an electronic system and an interface, according to example embodiments.

FIG. 14 shows an electronic system 3000 and an interface according to example embodiments.

Referring to FIG. 14, the electronic system 3000 may be realized as a data processing device, for example, a mobile phone, a PDA, a PMP, or a smart phone that may use or support an interface by a mobile industry processor interface (MIPI). The electronic system 3000 may include an application processor 3010, an image sensor 3040, a display 3050, an RF chip 3060, a storage 3070, a DRAM 3085, and a speaker 3090. Each of the application processor 3010, the image sensor 3040, the display 3050, the RF chip 3060, the storage 3070, the DRAM 3085, and the speaker 3090 may be one of the devices described with reference to FIGS. 1-3, 4A, 4B, and 5-13. Accordingly, each of the application processor 3010, the image sensor 3040, the display 3050, the RF chip 3060, the storage 3070, the DRAM 3085, and the speaker 3090 may be connected by a single wire of a wire or wireless communication with each other.

A CSI host 3012 realized in the application processor 3010 may have a serial communication with a CSI device 3041 of the image sensor 3040 through a camera serial interface (CSI). At this point, for example, a light deserializer may be realized in the CSI host 3012, and a light serializer may be realized in the CSI device 3041. A DSI host 3011 realized in the application processor 3010 may communicate with a DSI device 3051 of the display 3050 through a display serial interface (DSI). At this point, a light serializer may be realized in the DSI host 3011 and a light deserializer may be realized in the DSI device 3051.

A PHY 3013 of the electronic system 3000 and a PHY 3061 of the RF chip 3060 may exchange data according to a MIPI DigRF. The electronic system 3000 may communicate by using a Wimax 3030, a WLAN 3100, and a UWB 3110.

Example embodiments have been described with reference to the accompanying drawings. In the present specification, the example embodiments are described by using specific terms. However, it should be understood that the terms are used to explain the technical scope of the inventive concept not to limit the scope of the inventive concept described in the claims. Therefore, it will be understood by those of ordinary skill in the art that various changes in form and details may be made therein without departing from the spirit and scope of the inventive concept. Therefore, the scope of the inventive concept is defined not by the detailed description above but by the appended claims.

What is claimed is:

1. A method of operating a first device connected to a second device by a first wire, the method comprising:
   transmitting a first packet to the second device through the first wire;
   waiting to receive a second packet from the second device; and
   receiving the second packet from the second device through the first wire,
   wherein when the waiting to receive the second packet is started, electrically connecting a first end of a resistor to the first wire, and when the waiting to receive the second packet is terminated, electrically disconnecting the first end of the resistor from the first wire,
   wherein a second end of the resistor is connected to either a logic high level voltage source or a logic low level voltage source,
   wherein each of the first packet and the second packet includes a start bit, a data bit, and a stop bit,
   wherein the waiting to receive the second packet is started when the stop bit of the first packet is transmitted, and
   wherein the waning to receive the second packet is terminated when the start bit of the second packet is detected.

2. The method of claim 1,
   wherein the start bit has a first logic level and the stop bit has a second logic level opposite to the first logic level.

3. The method of claim 1, wherein the logic high level voltage source is a power supply voltage and the logic low level voltage source is a ground voltage.

4. The method of claim 1,
   wherein a level of the stop bit of the first packet is maintained during the waiting to receive the second packet, and
   wherein the start bit of the first packet has a first logic level and the stop bit of the first packet has a second logic level opposite to the first logic level.

5. The method of claim 1, wherein the transmitting of the first packet comprises transmitting a request packet having a number of consecutive low level bits or a number of consecutive high level bits greater than a predetermined number of bits.

6. The method of claim 5, further comprising:
   performing a request operation corresponding to the request packet when the second device receives the request packet,
   wherein the request operation includes a reset operation.

7. The method of claim 1, further comprising:
   requesting read data to the second device,
   wherein the receiving the second packet comprises receiving a request packet having a number of consecutive low level bits or a number of consecutive high level bits greater than a predetermined number of bits.

8. The method of claim 7, further comprising:
   performing a request operation corresponding to the request packet when the first device receives the request packet,
   wherein the request operation includes a reset operation.

9. The method of claim 7, further comprising:
   determining whether the second packet is the request packet or not by counting a number of the consecutive low level bits or a number of the consecutive high level bits of the second packet.

10. A system comprising:
    a first device including a first resistor; and
    a second device connected to the first device by a first wire,
    wherein the first device is configured to transmit a first packet to the second device through the first wire, and to wait for a second packet from the second device,
    wherein the first device is configured to receive the second packet through the first wire,
    wherein the first device is configured such that:
    a first end of the first resistor electrically connects to the first wire when the first device waits the second packet from the second device, and
    the first end of the first resistor electrically disconnects from the first wire when the first device receives the second packet from the second device,
    wherein a second end of the first resistor is connected to either a logic high level voltage source or a logic low level voltage source,
    wherein each of the first packet and the second packet includes a start bit, a data bit, and a stop bit,
    wherein the first device is configured such that as a result of the first device transmitting the stop bit of the first packet, the first end of the first resistor is connected to the first wire, and
    wherein the first device is configured such that as a result of the first device receiving the start bit of the second packet, the first end of the first resistor is disconnected from the first wire.

11. The system of claim 10,
    wherein the start bit has a first logic level and the stop bit has a second logic level opposite to the first logic level.

12. The system of claim 11, wherein the first device is configured to start a transmission of the data bit of the first packet while the start bit of the first packet is maintained the first logic level.

13. The system of claim 10, further comprising:
    a first request packet detector of the first device, configured to reset a state of the first device in response to the second packet including a request packet having a number of consecutive low level bits or a number of consecutive high level bits greater than a predetermined number of bits; and
    a second request packet detector of the second device, configured to reset a state of the second device in response to the first packet including a request packet having a number of consecutive low level bits or a number of consecutive high level bits greater than a predetermined number of bits.

14. The system of claim 13, wherein each of the first and second request packet detectors includes a counter configured to count the number of consecutive low level bits or the number of consecutive high level bits.

15. A method of data communication bi-directionally in a system comprising a first device and a second device connected to each other by a first wire, the method comprising:

transmitting a first packet to the second device through the first wire;

changing a transmission direction over the first wire from starting at the first device to starting at the second device; and receiving a second packet from the second device by the first device over the first wire, wherein each of the first packet and the second packet includes a start bit, a data bit, and a stop bit, wherein the changing the transmission direction is started when the stop bit of the first packet is transmitted, wherein the changing the transmission direction is terminated when the start bit of the second packet is detected, and wherein the receiving of the second packet comprises receiving a request packet having a number of consecutive low level bits or a number of consecutive high level bits greater than a predetermined number of bits.

16. The method of claim 15, wherein when the changing the transmission direction is started, connecting a first end of a resistor to the first wire, and when the changing the transmission direction is terminated, disconnecting the first end of the resistor from the first wire, and wherein a second end of the resistor is connected to either a logic high level voltage source or a logic low level voltage source.

17. The method of claim 16, wherein the logic high level voltage source is a power supply voltage and the logic low level voltage source is a ground voltage.

18. The method of claim 16, wherein the start bit has a first logic level and the stop bit has a second logic level opposite to the first logic level.

19. The method of claim 15, further comprising:
detecting the request packet by a request packet detector included in the system.

20. The method of claim 15, further comprising:
performing a reset operation of the first device when the first device receives the request packet from the second device.

* * * * *